(12) United States Patent
Lee et al.

(10) Patent No.: US 6,861,714 B2
(45) Date of Patent: Mar. 1, 2005

(54) HIGH-SPEED PROGRAMMABLE READ-ONLY MEMORY (PROM) DEVICES

(75) Inventors: Joong-Eon Lee, Seoul (KR); Young-keun Lee, Kyungki-do (KR); Yong-jae Choo, Seoul (KR); Young-sook Do, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/124,717

(22) Filed: Apr. 17, 2002

(65) Prior Publication Data

US 2002/0179999 A1 Dec. 5, 2002

(30) Foreign Application Priority Data

Apr. 18, 2001 (KR) ........................................ 2001-20809
Apr. 13, 2002 (KR) ........................................ 2002-20234

(51) Int. Cl.[7] .......................... H01L 29/76; H01L 29/94; H01L 31/062; H01L 31/113
(52) U.S. Cl. ........................................................ 257/390
(58) Field of Search ............................ 257/390; 365/94, 365/104, 51, 63; 138/128–130, 275, 278, 290

(56) References Cited

U.S. PATENT DOCUMENTS 6,507,525 B1 * 1/2003 Nobunaga et al. .......... 365/203
6,542,396 B1 * 4/2003 Becker ......................... 365/94

FOREIGN PATENT DOCUMENTS

KR 2000-62527 A 10/2000

OTHER PUBLICATIONS

Notice to Submit Response, Korean Application No. 2002–20234, May 31, 2004.

* cited by examiner

Primary Examiner—Craig A. Thompson
(74) Attorney, Agent, or Firm—Myers Bigel Sibley & Sajovec

(57) ABSTRACT

A high speed programmable ROM, a memory cell structure therefor, and a method for writing data on/reading data from the programmable ROM are provided. The programmable ROM system has a plurality of memory cell, each of which has a gate, a first electrode, and a second electrode; a plurality of word lines, each of which is connected to the gates of a predetermined number of cells of the plurality of memory cells; a plurality of bit lines, each of which is connected to the first electrodes of a predetermined number of memory cells of the plurality of memory cells and is arranged in a direction substantially perpendicular to the word lines; and a plurality of virtual ground lines, each of which is selectively connected to ground in response to control signals, and is arranged in a direction actually perpendicular to the word lines, wherein the plurality of memory cells are programmed to predetermined logic levels by selectively connecting the second electrode of each of the plurality of memory cells to the plurality of virtual ground lines. The high speed programmable ROM system selectively connects the source of a cell transistor to a virtual ground line according to ROM data such that the capacitance of a bit line can be maintained at a predetermined level without becoming excessively great or small. Thus, the operation speed of the programmable ROM increases and misreading programmed data is minimized.

6 Claims, 6 Drawing Sheets

☐ : DIFFUSION CONTACT
■ : PROGRAMMING VIA

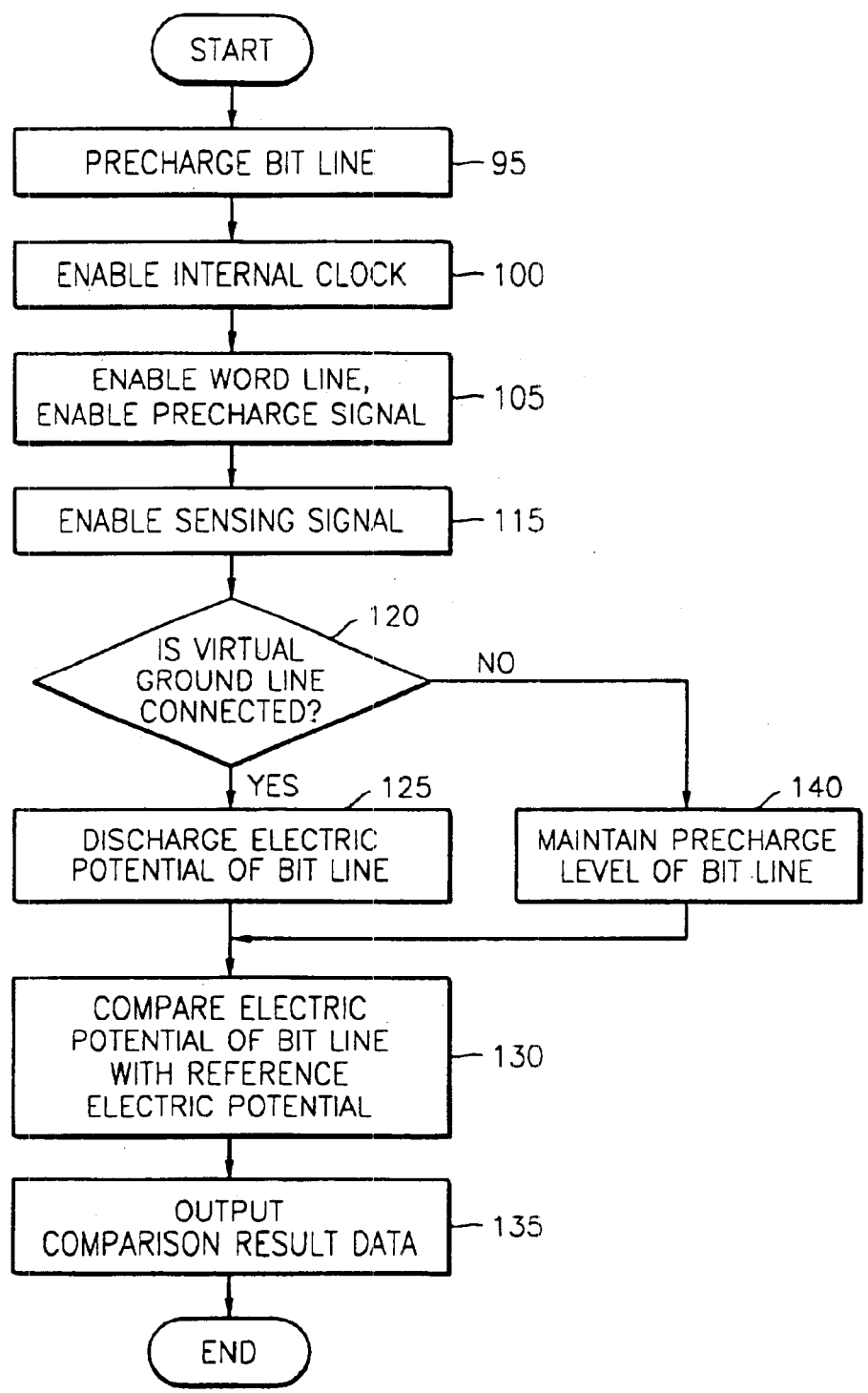

HIGH-SPEED PROGRAMMABLE READ-ONLY MEMORY (PROM) DEVICES

BACKGROUND OF THE INVENTION

1. Field of the Invention

The present invention relates to a semiconductor memory device, and more particularly, to a high speed programmable Read Only Memory (ROM) system.

2. Description of the Related Art

Mask ROM is a semiconductor memory device in which a user codes needed data in advance on the memory device in a manufacturing process so that the coded data can be repeatedly read later. Mask ROMs include an embedded diffusion-programmable ROM and an embedded metal-programmable ROM. For the embedded diffusion-programmable ROM, a ROM data code is determined in a diffusion process in the manufacturing processes, while for the embedded metal-programmable ROM, a ROM data code is determined in a metal processing process in the manufacturing processes.

Meanwhile, there is an embedded contact programmable ROM or an embedded via programmable ROM which is almost the same as the embedded metal-programmable ROM. For the embedded contact programmable ROM, a ROM data code is determined in a contact processing process in the manufacturing processes, while for the embedded via programmable ROM, a ROM data code is determined in a via processing process in the manufacturing processes.

Generally, the embedded diffusion-programmable ROM has been preferred over the embedded metal-programmable ROM, mainly because the former can achieve an integration about 25% higher than that of the latter.

However, the embedded diffusion-programmable ROM has a longer time interval from when data from a user is received to when a completed product is manufactured, that is, the turn-around time of the embedded diffusion-programmable ROM is longer than that of the embedded metal-programmable ROM. Recently, thanks to technology development in semiconductor manufacturing processes, integration of the embedded metal (or via)-programmable ROM has greatly increased, and the importance of the embedded metal (or via)-programmable ROM which is advantageous in Time-to-Market has increased.

FIG. 1 is a diagram showing the cell array structure in a prior art metal programmable ROM. For convenience of explanation, FIG. 1 shows a 4×4 bit cell array structure formed with 2 bit lines BL0 and BL1, 3 virtual ground lines VG0~VG2, 4 word lines WL0~WO3, and 16 cell transistors M1~M16. Here, a virtual ground line is a line which is selectively connected to ground by a switch (not shown). Also, capacitors C1~C4 of FIG. 1 show not actual circuit elements but coupling capacitance between lines. C5 is a total capacitance of bit line BL0, and C6 is a total capacitance of bit line BL1.

Referring to FIG. 1, the gate of each of 16 cell transistors M1~M16 is connected to a word line, and the source of each transistor M1~M16 is connected to a virtual ground line. The drain of each transistor M1~M16 can be electrically connected to a bit line selectively to program the cell transistor. That is, by electrically connecting the drain of a cell transistor M1~M16 to a bit line, the cell transistor is programmed to have "0", and by floating the drain, the transistor is programmed to have "1". Meanwhile, the speed of the programmable ROM depends on a total capacitance loaded on a bit line. The total capacitance loaded on a bit line determines a time interval from when a bit line is precharged to when the bit line is discharged. Accordingly, if the total capacitance is big, the overall operation speed of the ROM is lowered.

Also, a ratio of a coupling capacitance between a bit line and a neighboring line to the total capacitance of the bit line is an important factor in evaluating a programmable ROM. If this ratio is big, the transition in the neighboring line interferes the bit line, and the bit line which is precharged may not be able to maintain the precharged state and therefore may cause to misread ROM data. To prevent this error, the ratio of a coupling capacitance between the bit line and a neighboring line to the total capacitance of the bit line is made to be small. For this, the total capacitance loaded on a bit line should be increased, but this causes a decrease in speed.

In the programmable ROM of FIG. 1, cells connected to bit line BL0 are programmed to have "0", and cells connected to bit line BL1 are programmed to have "1". At this time, total capacitance C5 loaded to bit line BL0 becomes the maximum, total capacitance C6 loaded to bit line BL1 becomes the minimum, and the operation speed of the programmable ROM is determined by bit line BL0.

Here, factors affecting the capacitance of bit line BL0 are capacitance by the bit line length, capacitance by the programming metal line 28, capacitance by a contact CNT1 connected to the bit line, and capacitance by transistors M1~M8 connected to the bit line. The total capacitance C5 of bit line BL0 has a very big value due to the influence of these capacitances, and accordingly the speed of the programmable ROM is lowered. However, as the ratio of the coupling capacitance between the bit line BL0 and the neighboring line VG0 or VG1 to the total capacitance of the bit line BL0 (=C1/C5, or C2/C5) becomes smaller, misreading ROM data due to a coupling capacitance with a neighboring line can be prevented.

Meanwhile, since an only factor affecting the capacitance of bit line BL1 is capacitance by the bit line length, the total capacitance C6 of bit line BL1 has a very smaller value than C5. Therefore, as the ratio of the coupling capacitance between the bit line BL1 and the neighboring line VG1 or VG2 to the total capacitance of the bit line BL1 (=C3/C6, or C4/C6) becomes bigger, misreading ROM data of cells connected to the bit line BL1 due to a coupling capacitance may occur. Thus, in order to prevent misreading ROM data due to a coupling capacitance, when ROM data is read, the operation speed of a sense amplifier should be decreased, or precharge and discharge time should be appropriately adjusted to avoid interference, but both cause decrease in the speed of the ROM.

SUMMARY OF THE INVENTION

To solve the above problems, it is a first objective of the present invention to provide a high speed programmable ROM system which improves a operation speed, and a memory cell structure therefor.

It is a second objective of the present invention to provide a method for writing data on and reading data from the programmable ROM.

It is a third objective of the present invention to provide a writing medium having thereon a computer executable program code for the method for writing data.

To accomplish the first objective of the present invention, there is provided a programmable memory cell in a programmable Read Only Memory (ROM) having a plurality of programmable memory cells, the programmable memory cell having a word line; a bit line; a virtual ground line which is selectively connected to ground in response to a control signal; and a cell transistor which has a gate which is connected to the word line, a first electrode, and a second electrode which is connected to the bit line, in which the cell transistor is programmed to a predetermined logic level by selectively connecting the first electrode to the virtual ground line.

Also, to accomplish the first objective of the present invention, there is provided a programmable ROM having a plurality of memory cell, each of which has a gate, a first electrode, and a second electrode; a plurality of word lines, each of which is connected to the gates of a predetermined number of cells of the plurality of memory cells; a plurality of bit lines, each of which is connected to the first electrodes of a predetermined number of memory cells of the plurality of memory cells and is arranged in a direction substantially perpendicular to the word lines; and a plurality of virtual ground lines, each of which is selectively connected to ground in response to control signals, and is arranged in a direction actually perpendicular to the word lines, in which the plurality of memory cells are programmed to predetermined logic levels by selectively connecting the second electrode of each of the plurality of memory cells to the plurality of virtual ground lines.

To accomplish the second objective of the present invention, there is provided a method for writing binary data on a cell transistor in a programmable ROM containing a plurality of cell transistors having a gate, a first electrode and a second electrode, the method including connecting the gate and the first electrode to a word line and a bit line, respectively; and selectively connecting the second electrode to a virtual ground line which is selectively connected to ground, according to binary data desired to be written.

Also, to accomplish the second objective of the present invention, there is provided another method a method for reading binary data stored in a cell transistor in a programmable ROM containing a plurality of cell transistors, each of which has a gate, a first electrode, and a second electrode, the method including (a) precharging a bit line connected to the first electrode of the cell transistor to a "high" logic level; (b) if the second electrode of the cell transistor is connected to a virtual ground line, discharging the electric potential of the bit line precharged in step (a) to ground through the virtual ground line; (c) if the second electrode of the cell transistor is not connected to the virtual ground line, maintaining the electric potential of the bit line precharged in step (a); (d) sensing the electric potential of the bit line; and (e) comparing the sensed electric potential of the bit line with a reference electric potential, and reading binary ROM data according to the comparison result.

BRIEF DESCRIPTION OF THE DRAWINGS

The above objects and advantages of the present invention will become more apparent by describing in detail preferred embodiments thereof with reference to the attached drawings in which:

FIG. 6 is a flowchart showing a process for reading data performed in the programmable ROM system of FIG. 4.

DESCRIPTION OF THE PREFERRED EMBODIMENTS

Figure 2:
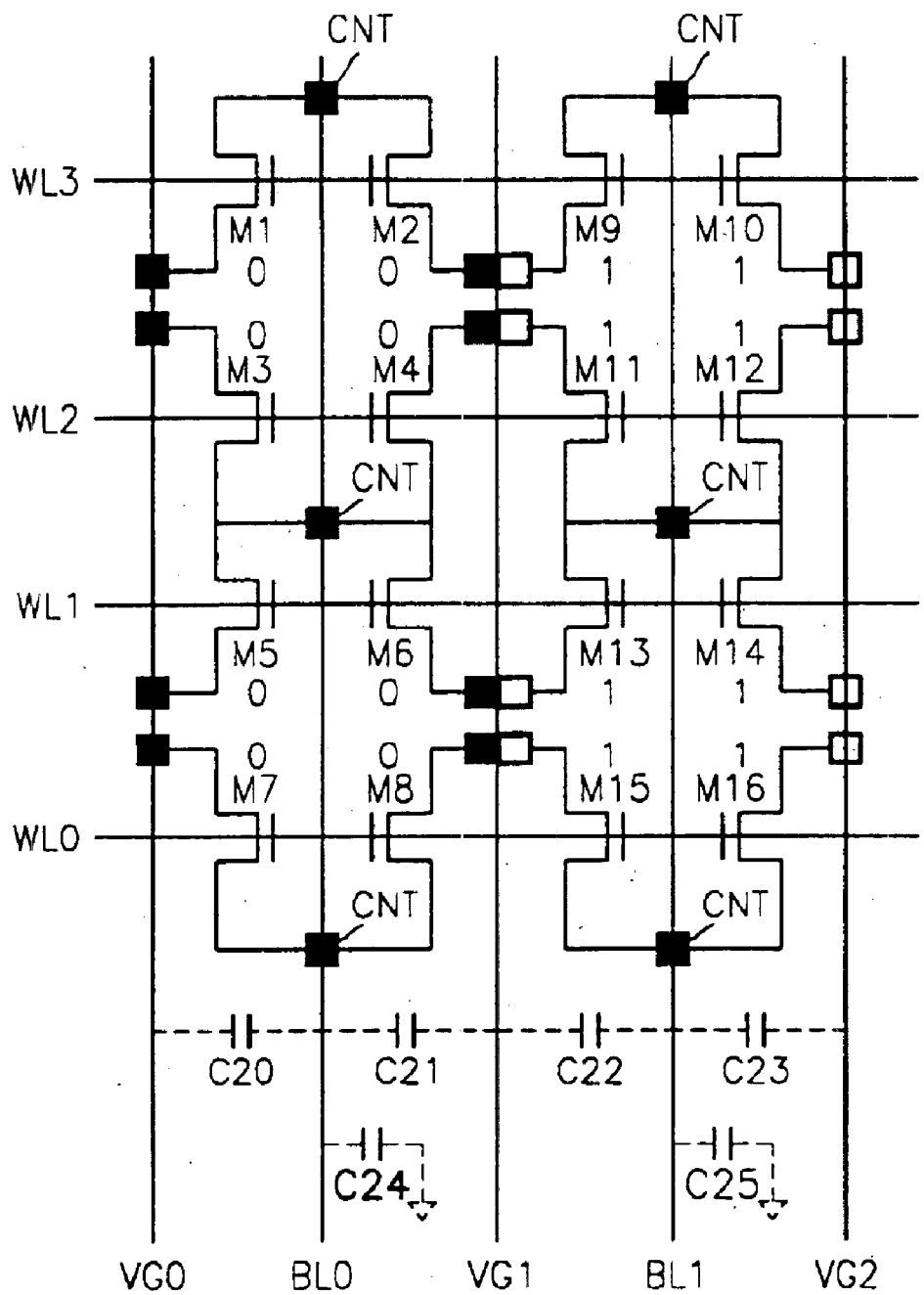
FIG. 2 is a circuit diagram showing a preferred embodiment of the cell array structure of a high speed programmable ROM according to the present invention.

FIG. 2 is a circuit diagram showing a preferred embodiment of the cell array structure of a high speed programmable ROM according to the present invention.

Figure 1:
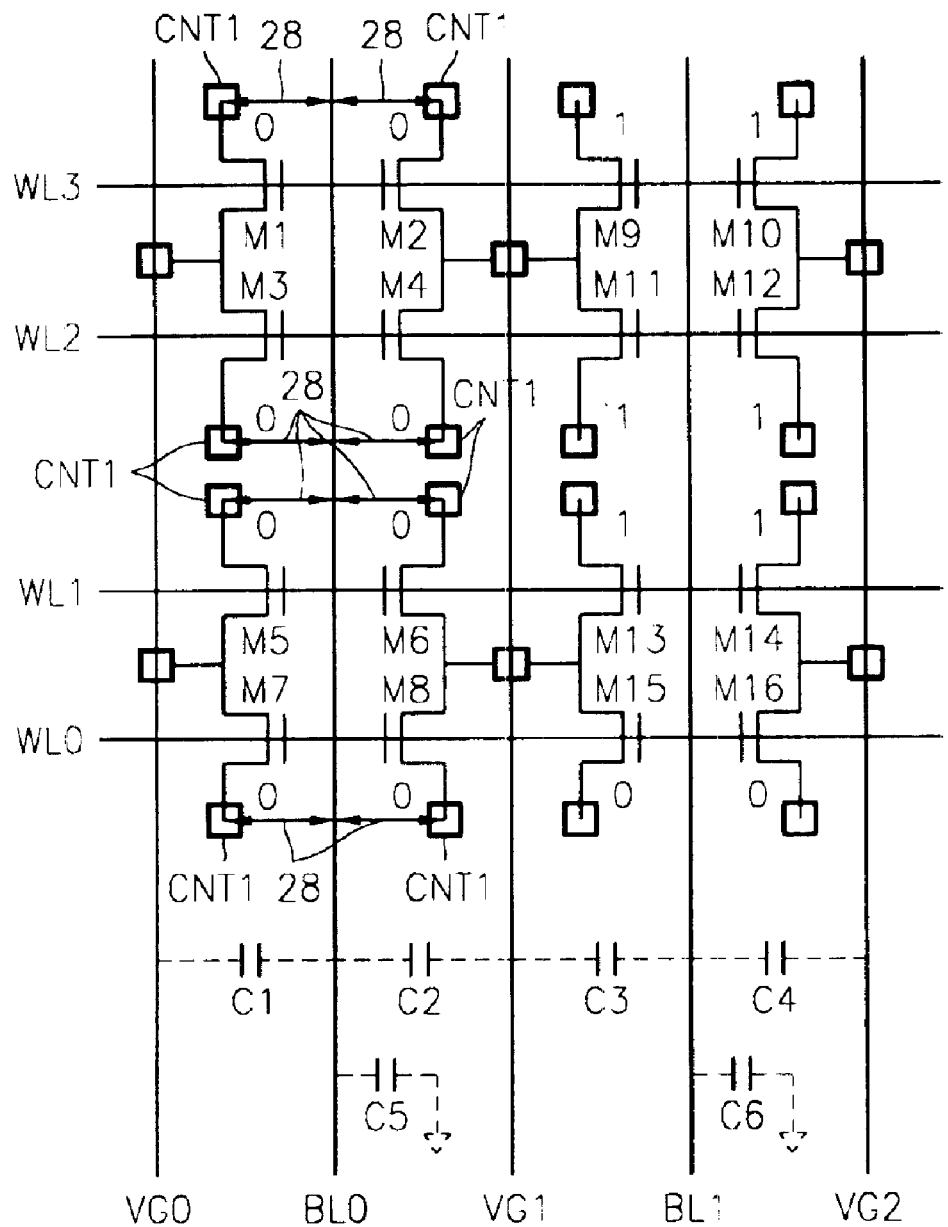
FIG. 1 is a diagram showing the cell array structure in a prior art metal programmable ROM.

For convenience of explanation, FIG. 2 shows a 4×4 bit cell array structure formed with 2 bit lines BL0 and BL1, 3 virtual ground lines VG0~VG2, 4 word lines WL0~WO3, and 16 NMOS transistors M1~M16. Here, capacitors C20~C23 of FIG. 1 show not actual circuit elements but coupling capacitance between lines. C24 is a total capacitance loaded on bit line BL0, and C25 is a total capacitance loaded on bit line BL1. Also for convenience of explanation, the programmable ROM shown in FIG. 2 is assumed to be a via programmable ROM of which ROM data programming is performed in a via processing process.

Referring to FIG. 2, the drain of each of cell transistors M1~M8 is connected to bit line BL0, and the drain of each of cell transistors M9~M10 is connected to bit line BL1. At this time, in the structure shown in FIG. 2, four cell transistors M1~M4 and four cell transistors M5~M8, each four cell transistors horizontally and vertically neighboring with each other adjacent to bit line BL0 share bit line BL0. Likewise, four cell transistors M9~M12 and four cell transistors M13~M16, each four cell transistors horizontally and vertically neighboring with each other adjacent to bit line BL1 share bit line BL1.

For convenience of explanation, it is assumed that cell transistors M1~M8 are programmed to have "0", and cell transistors M9~M16 are programmed to have "1". For this, in order to program cell transistors M1~M8 to have "0", the source of each of cell transistors M1~M8 is connected to virtual ground line VG0 or VG1. Also, in order to program cell transistors M9~M16 to have "1", the source of each of cell transistors M9~M16 is made to be in a floating state in which the source is not connected to any one of virtual ground lines VG1 and VG2. In FIG. 2, '■' indicates a state in which a cell transistor is electrically connected to a virtual ground line or a bit line, and '□' indicates a state in which a cell transistor is not connected.

Thus, as ROM data is programmed to be in a cell transistor according to whether or not the source of the cell transistor is connected to a virtual ground line, the total capacitances C24 and C25 of bit lines BL0 and BL1 have the same value regardless of whether a cell transistor is programmed to have "0" or "1". Meanwhile, the capacitance of the virtual ground line may change according to the program data. However, since the virtual ground line is a signal which performs full swing from a "high" logic level to a "low" logic level and vice versa, unlike a bit line which performs small swing, whether line capacitance is big or small does not greatly affect the operation speed of the ROM.

Meanwhile, factors affecting the total capacitances C24 and C25 of bit lines BL0 and BL1 are capacitance by the bit line length, capacitance by a contacts CNT connected to the bit line, and capacitance by transistors M1~M8 connected to the bit line. If compared with the total capacitances C5 and C6 of bit lines BL0 and BL1 shown in FIG. 1, each of capacitances C24 and C25 is not affected by capacitance by programming metal, and therefore is smaller than C5. Meanwhile, due to the influence of capacitance by contacts CNT connected to the bit line and capacitance by transistors M1~M8 connected to the bit line, each of capacitances C24 and C25 is greater than C6. Here, the fact that C24 is smaller than C5 means that the speed for discharging the bit line of C24 is faster than that of C5. Also, since capacitance C25 is greater than C6, the ratio of a coupling capacitance with a neighboring line becomes smaller, and therefore, misreading data programmed in a cell transistor due to interference of the neighboring line can be reduced.

Accordingly, the programmable ROM according to the present invention which selectively connects the source of a cell transistor to a virtual ground line according to ROM data, can make the operation speed faster than the prior art programmable ROM which selectively connects the source of a cell transistor to a bit line, and minimize misreading programmed data.

Meanwhile, though for convenience of explanation it is assumed that the programmable ROM shown in FIG. 2 is a via programmable ROM of which ROM data programming is performed in a via processing process, the present invention can be applied to a contact programmable ROM and a metal programmable ROM with the same result.

Figure 3:
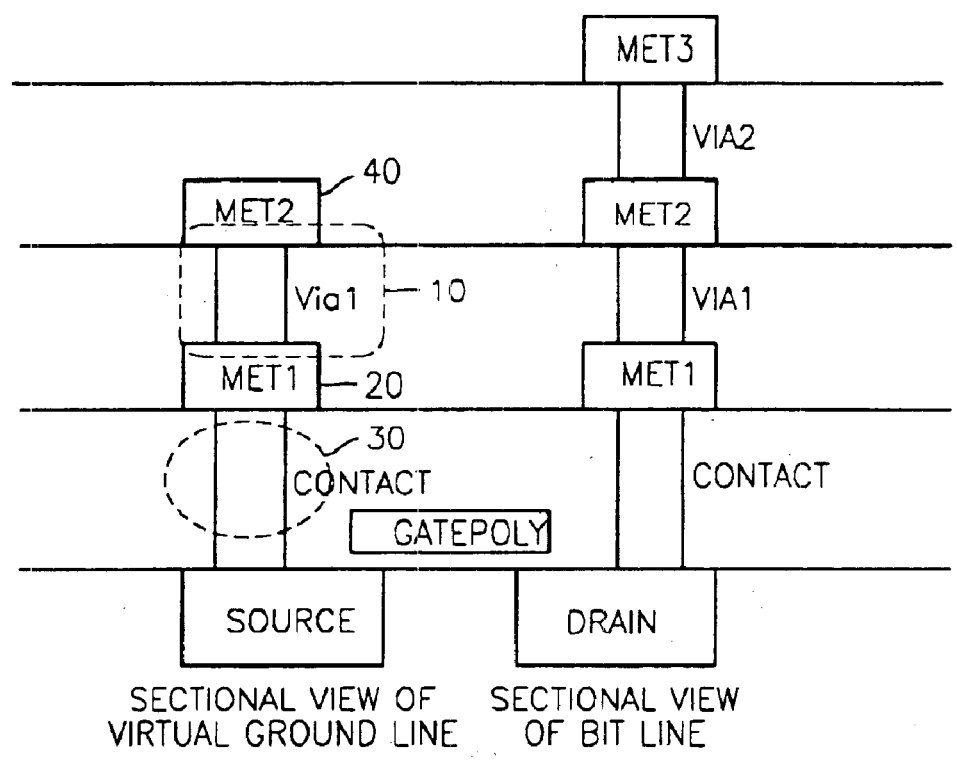
FIG. 3 is a sectional view showing a horizontal section of each cell transistor shown in FIG. 2.

FIG. 3 is a sectional view showing a horizontal section of each cell transistor shown in FIG. 2, and shows the section of a virtual ground line connected to the source of a cell transistor and the section of a bit line connected to the drain of a cell transistor.

Referring to FIG. 3, ROM data can be programmed to be in a cell transistor by selectively connecting the source to a virtual ground line through processes for forming a contact 30, metal1 20, via1 10, or metal2 40. That is, "0" is programmed to be in a cell transistor by electrically connecting the source of the cell transistor to a virtual ground line after forming all the contact 30, metal1 20, via1 10, and metal2 40. Also, "1" is programmed to be in a cell transistor by floating the source of the cell transistor away from a virtual ground line by not forming any one of the contact 30, metal1 20, via1 10, and metal2 40.

Figure 4:
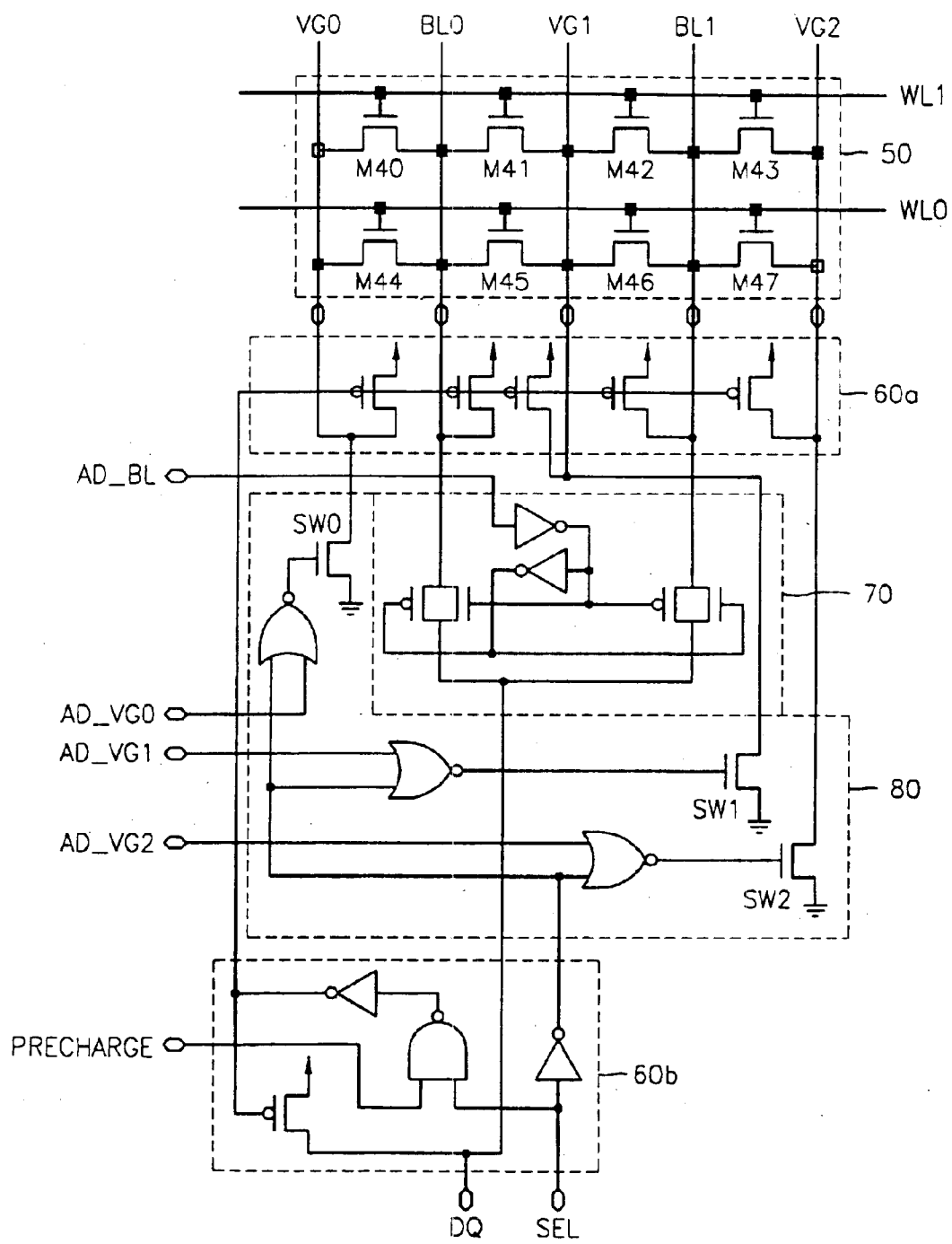
FIG. 4 is a circuit diagram showing a programmable ROM system according to the present invention.

FIG. 4 is a circuit diagram showing a programmable ROM system according to the present invention and the ROM system is formed with a cell transistor group 50, a precharge unit 60a, a precharge control unit 60b, a virtual ground line selection unit 80, and a bit line selection unit 70. In FIG. 4, '■' indicates a state in which a cell transistor is electrically connected to a virtual ground line or a bit line, and '□' indicates a state in which a cell transistor is not connected. That is, in the cell transistor group 50, data "0" is programmed to be in each cell transistor M41~M46, while data "1" is programmed to be in each of cell transistors M40 and M47.

Meanwhile, though one cell transistor group 50 is shown in FIG. 4, the programmable ROM system may have a plurality of cell transistor groups 50, and a cell group selection signal SEL is a signal selecting one or some of the plurality of cell transistor groups.

The precharge control unit 60b performs logic combination of the cell group selection signal SEL and a precharge signal to generate a precharge control signal. The precharge circuit 60a precharges the virtual ground lines VG0~VG2 and bit lines BL0 and BL1, by turning on/off transistors connected to the virtual ground lines VG0~VG2 and bit lines BL0 and BL1 in response to the precharge control signal, The virtual ground line selection unit 80 combines the cell group selection signal SEL and virtual ground line selection signals AD_VG0~AD_VG2, and controls on/off of switches SW0~SW2 so that any one of the virtual ground lines VG0~VG2 is connected to ground.

In response to bit line selection signal AD_BL, the bit line selection unit 70 selects any one of bit lines BL0 and BL1, and outputs data programmed in a cell transistor connected to the selected bit line, through a data output port DQ.

Figure 5:
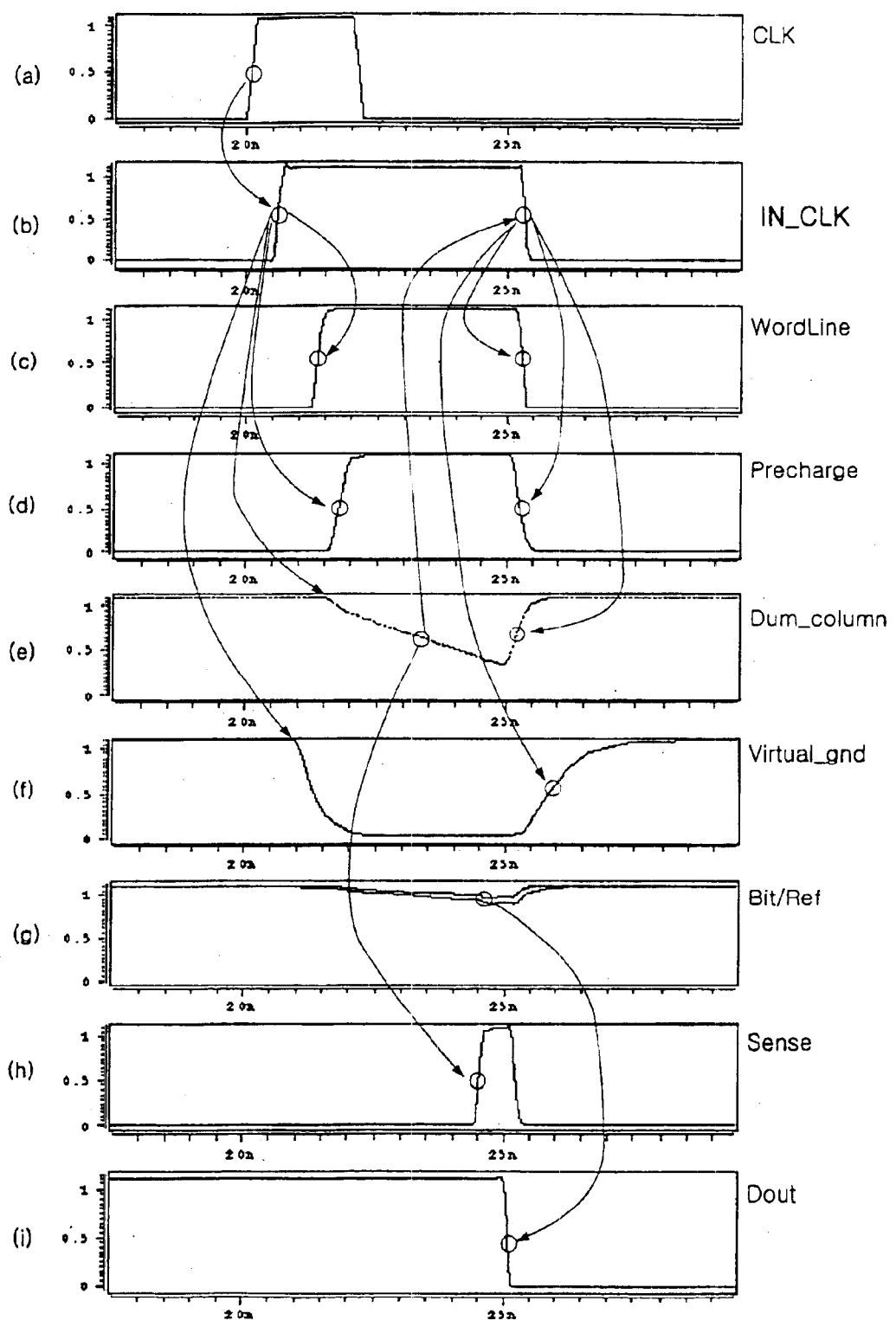
FIG. 5 is a timing diagram of signals controlling the operation of the circuit shown in FIG. 4.

FIG. 5 is a timing diagram of signals controlling the operation of the circuit shown in FIG. 4. FIG. 6 is a flowchart showing a process for reading data performed in the programmable ROM system of FIG. 4.

Referring to FIGS. 4 through 6, till there is a request for reading data from the outside, the precharge signal is maintained to be a "low" logic level. By the "low" logic level precharge signal, transistors of the precharge unit 60a is turned on, and the bit lines BL0 and BL1 and the virtual ground lines VG0~VG2 are precharged in step 95.

Then, if a clock signal CLK requesting to read data from the outside is generated as shown in FIG. 5(a), in response to the signal, an internal clock signal IN_CLK is enabled as shown in FIG. 5(b) in step 100. In response to internal clock signal IN_CLK, word lines WL and precharge signals are sequentially enabled, as shown in FIGS. 5(c) and (d), in step 105. Referring to FIG. 4, if the precharge signal is enabled to transit to a "high" logic level, transistors forming the precharge unit 60a are turned off by the precharge control unit 60b, and precharge is stopped.

Next, with internal clock signal IN_CLK being enabled, virtual ground line selection signals AD_VG0~AD_VG2 are input, and a virtual ground line selected by the signals is discharged to ground level. At this time, in response to the electric potential, a control signal which controls disabling internal clock signal IN_CLK and enabling a sense signal is discharged as shown in FIG. 5(e). That is, the control signal shown in FIG. 5(c) starts discharge in response to internal clock signal IN_CLK, and in response to the control signal falling under a predetermined level, internal clock signal IN_CLK is disabled and the sense signal is enabled in step 115.

When the sense signal is thus enabled, according to whether or not the source of a cell transistor selected by the virtual ground line selection signals AD_VG0~AD_VG2 and bit line selection signal AD_BL is connected to the virtual ground line in step 120, the electric potential of the bit line connected to the drain of the selected cell transistor will have an electric potential higher or lower than a reference voltage.

For example, it is assumed that data programmed in cell transistors M40 and M44 connected to bit line BL0 by the virtual ground line selection signals AD_VG0~AD_VG2 and bit line selection signal AD_BL are to be read. First, in order to read data programmed in cell transistor M40, switch SW0 is first turned on by virtual ground line selection signal AD_VG0, and virtual ground line VG0 is connected to ground. At this time, since the source is not connected to the virtual ground line, the electric potential precharged to the bit line connected to the drain of cell transistor M40 cannot be discharged to ground, and maintains the precharge electric potential without change in step 140. Meanwhile, since the source of cell transistor M44 is connected to the virtual ground line, the electric potential precharged in the bit line connected to the drain of cell transistor M44 is discharged to ground through virtual ground line VG0 in step 125.

Therefore, according to whether or not the source of a cell transistor is connected to a virtual ground line, the electric potential of a bit line is discharged or maintains a precharged electric potential without change, and the electric potential of the bit line is compared with a reference electric potential REF which is a criterion for determined data in step 130. When the electric potential of the bit line is discharged through the virtual ground line, if the electric potential of the bit line is lower than the reference electric potential REF as shown in FIG. 5(g) at a time when the sense signal is enabled as shown in FIG. 5(h), data "0" is read as shown in FIG. 5(i) in step 135. Meanwhile, when the electric potential of the bit line maintains the precharge electric potential without change, and if the electric potential of the bit line is higher than the reference electric potential REF at a time when the sense signal is enabled as shown in FIG. 5(h), data "1" is read in step 135.

The present invention may be embodied in a code, which can be read by a computer, on a computer readable recording medium. The computer readable recording medium includes all kinds of recording apparatuses on which computer readable data are stored.

The computer readable recording media includes storage media such as magnetic storage media (e.g., ROM's, floppy disks, hard disks, etc.), optically readable media (e.g., CD-ROMs, DVDs, etc.) and carrier waves (e.g., transmissions over the Internet). Also, the computer readable recording media can be scattered on computer systems connected through a network and can store and execute a computer readable code in a distributed mode.

So far, optimum embodiments are explained in the drawings and specification, and though specific terminologies are used here, those were only to explain the present invention. Therefore, the present invention is not restricted to the above-described embodiments and many variations are possible within the spirit and scope of the present invention. The scope of the present invention is not determined by the description but by the accompanying claims.

As described above, the high speed programmable ROM system according to the present invention selectively connects the source of a cell transistor to a virtual ground line according to ROM data such that the capacitance of a bit line can be maintained at a predetermined level without becoming excessively great or small. Thus, the operation speed of the programmable ROM increases and misreading programmed data is minimized.

What is claimed is:

1. An integrated circuit device, comprising:

a plurality of bit lines; and an array of programmable read-only memory (PROM) cells that are electrically coupled to said plurality of bit lines and are configured to provide equivalent capacitive loading on said plurality of bit lines in a manner that is independent of a program state of the PROM cells in said array.

2. The device of claim 1, wherein said array of PROM cells is an array of via-programmable read only memory (VPROM) cells.

3. The device of claim 2, further comprising a plurality of virtual ground lines that are electrically coupled to said array of PROM cells.

4. The device of claim 3, wherein the program state of each of a plurality of PROM cells in said array is set by a presence or absence of a via providing an electrical short between an electrode of a respective one of the plurality of PROM cells and an associated virtual ground line.

5. A programmed read-only memory (ROM) device, comprising:

a plurality of bit lines;

a plurality of virtual ground lines; and an array of via-programmed ROM cells that are electrically coupled to said plurality of bit lines and said plurality of virtual ground lines and are configured to provide equivalent capacitive loading on said plurality of bit lines in a manner that is independent of a programmed state of the ROM cells in said array.

6. The ROM device of claim 5, wherein the programmed state of each of a plurality of ROM cells in said array is determined by a presence or absence of a respective via that provides an electrical short between a terminal of a respective ROM cell and an associated virtual ground line.

* * * * *